United States Patent
Ireland

(10) Patent No.: US 7,352,019 B2
(45) Date of Patent: *Apr. 1, 2008

(54) CAPACITANCE REDUCTION BY TUNNEL FORMATION FOR USE WITH A SEMICONDUCTOR DEVICE

(75) Inventor: Philip J. Ireland, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 158 days.

This patent is subject to a terminal disclaimer.

(21) Appl. No.: 11/156,160

(22) Filed: Jun. 17, 2005

(65) Prior Publication Data

US 2005/0233574 A1    Oct. 20, 2005

Related U.S. Application Data

(60) Continuation of application No. 10/676,066, filed on Sep. 30, 2003, now Pat. No. 6,909,128, which is a division of application No. 10/071,906, filed on Feb. 7, 2002, now Pat. No. 6,627,529.

(51) Int. Cl.
*H01L 29/80*    (2006.01)

(52) U.S. Cl. .............. 257/276; 257/522; 257/E21.581; 438/619; 438/E23.144

(58) Field of Classification Search ............... 257/276, 257/522, 758, 776, 766, E21.581, E23.144; 438/619, 624, 637
See application file for complete search history.

(56) References Cited

U.S. PATENT DOCUMENTS

| | | | |
|---|---|---|---|
| 5,965,940 A | 10/1999 | Juengling | 257/752 |
| 5,981,384 A | 11/1999 | Juengling | 438/666 |
| 5,994,776 A | 11/1999 | Fang et al. | 257/758 |
| 5,998,256 A | 12/1999 | Juengling | 438/253 |
| 6,121,552 A | 9/2000 | Brosnihan et al. | 174/253 |
| 6,136,687 A | 10/2000 | Lee et al. | 438/624 |
| 6,165,890 A | 12/2000 | Kohl et al. | 438/619 |
| 6,177,329 B1 | 1/2001 | Pang | 438/400 |
| 6,271,141 B2 | 8/2001 | Juengling et al. | 438/695 |
| 6,376,357 B1 | 4/2002 | Onuma | 438/619 |
| 6,399,476 B2 | 6/2002 | Kim et al. | 438/619 |
| 6,406,992 B1 | 6/2002 | Mao et al. | 438/622 |
| 6,423,630 B1 * | 7/2002 | Catabay et al. | 438/624 |
| 6,451,669 B2 | 9/2002 | Torres et al. | 438/409 |
| 6,589,861 B2 | 7/2003 | Park et al. | 438/619 |
| 6,909,128 B2 * | 6/2005 | Ireland | 257/276 |

* cited by examiner

*Primary Examiner*—Quoc Hoang

(57) ABSTRACT

A method used during the manufacture of a semiconductor device comprises providing at least first, second, and third spaced conductive structures, where the second conductive structure is interposed between the first and third conductive structures. A first dielectric is formed over these conductive structures, then a portion of the first dielectric layer is removed which forms a hole in the dielectric layer to expose the second conductive structure. Subsequently, the second conductive structure is removed to leave a void or tunnel in the dielectric layer where the second conductive structure had previously existed. Finally, a second dielectric layer is provided to fill the hole but to leave the void or tunnel in the dielectric layer subsequent to the formation of the second dielectric layer. An inventive structure resulting from the inventive method is also described.

10 Claims, 5 Drawing Sheets

CAPACITANCE REDUCTION BY TUNNEL FORMATION FOR USE WITH A SEMICONDUCTOR DEVICE

This is a continuation of U.S. application Ser. No. 10/676,066 filed Sep. 30, 2003 and issued Jun. 21, 2005 as U.S. Pat. No. 6,909,128, which was a division of U.S. application Ser. No. 10/071,906 filed Feb. 7, 2002 and issued Sep. 30, 2003 as U.S. Pat. No. 6,627,529.

FIELD OF THE INVENTION

This invention relates to the field of semiconductor manufacture, and more particularly to a method used to reduce undesired capacitive coupling between adjacent conductive structures. An inventive structure resulting from the method is also described.

BACKGROUND OF THE INVENTION

During the formation of semiconductor devices such as dynamic random access memories (DRAM), static random access memories (SRAM), logic devices, and microprocessors, several structures are commonly formed. For example, parallel metal lines such as data lines as well as other conductive interconnects and buses are formed to provide an electrical pathway, for example a pathway for data bits to and from storage capacitors on a semiconductor memory device. As a goal in semiconductor device design is to minimize device dimensions and maximize density, many of the conductive lines are formed in close proximity to adjacent lines. Contrary to this goal is the effect of capacitive coupling between adjacent lines. To reduce capacitive coupling, the spacing between lines must be sufficiently wide to ensure any electrical effects created by the coupling are minimized so that incorrect data, clock and signal timing problems, power draw due to capacitor coupling, signal noise corruption, and device lockup do not result.

A method used during the formation of a semiconductor device which allows for closer formation of device features, and the structure having increased feature density which results therefrom, would be desirable.

SUMMARY OF THE INVENTION

The present invention provides a new method that, among other advantages, reduces problems associated with the manufacture of semiconductor devices. A particular problem with current manufacturing methods includes increased device size resulting from forming sufficiently spaced (widely spaced) parallel conductive lines to reduce capacitive coupling.

In accordance with one embodiment of the invention, a group of at least three conductive lines is formed, with the lines in close proximity to each other. Two lateral lines will be functional in a semiconductor device while a center line interposed between the two lateral lines is sacrificial. A first dielectric layer is formed over and between the conductive lines. In one embodiment a void (tunnel or gap) forms between each lateral conductive line and the center line due to the lack of a complete fill of dielectric between the lines. In another embodiment, these voids do not form. In either case, after formation of the first dielectric layer the center line is exposed, for example using an opening in the first dielectric layer of the type commonly used for a contact opening. At least a portion of the exposed center line is removed using a wet or dry etch, while the first dielectric layer remains in place over the two lateral lines so they are not etched. A second dielectric layer is formed over the three conductive lines which fills the opening in the first dielectric layer but not the underlying void created by removal of the exposed center. In various embodiments, one or three air gaps remain interposed between the two lateral conductive lines. These air gaps reduce capacitive coupling in the remaining lateral lines when compared with a solid dielectric layer. Wafer processing continues according to means known in the art.

Further advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of ordinary skill in the art by examination of the information herein.

DETAILED DESCRIPTION OF THE PREFERRED EMBODIMENT

Figure 3:
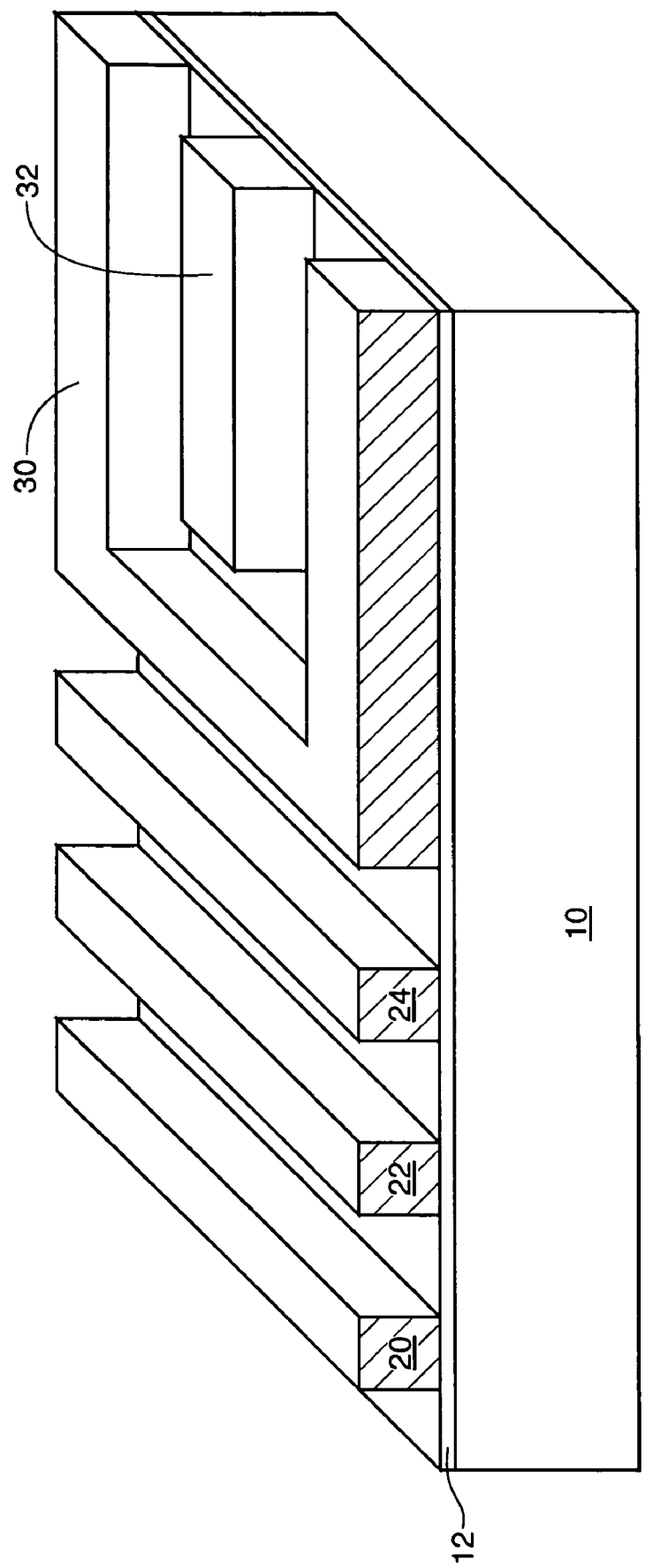
FIG. 3 depicts an alternate embodiment of the FIG. 2 structure (subsequent to removing the photoresist layer) comprising the use of a metal dummy feature to allow for the substantially planar formation of a dielectric layer without the use of a separate planarizing step.

FIGS. 1, 2, and 4-8 depict an embodiment of the invention which decreases the capacitive coupling between adjacent parallel conductive structures such as data lines. FIG. 3 depicts a structure used in an alternate embodiment. Embodiments of the invention may also be useful to reduce capacitive coupling in devices having adjacent conductive features other than data lines.

Figure 1:
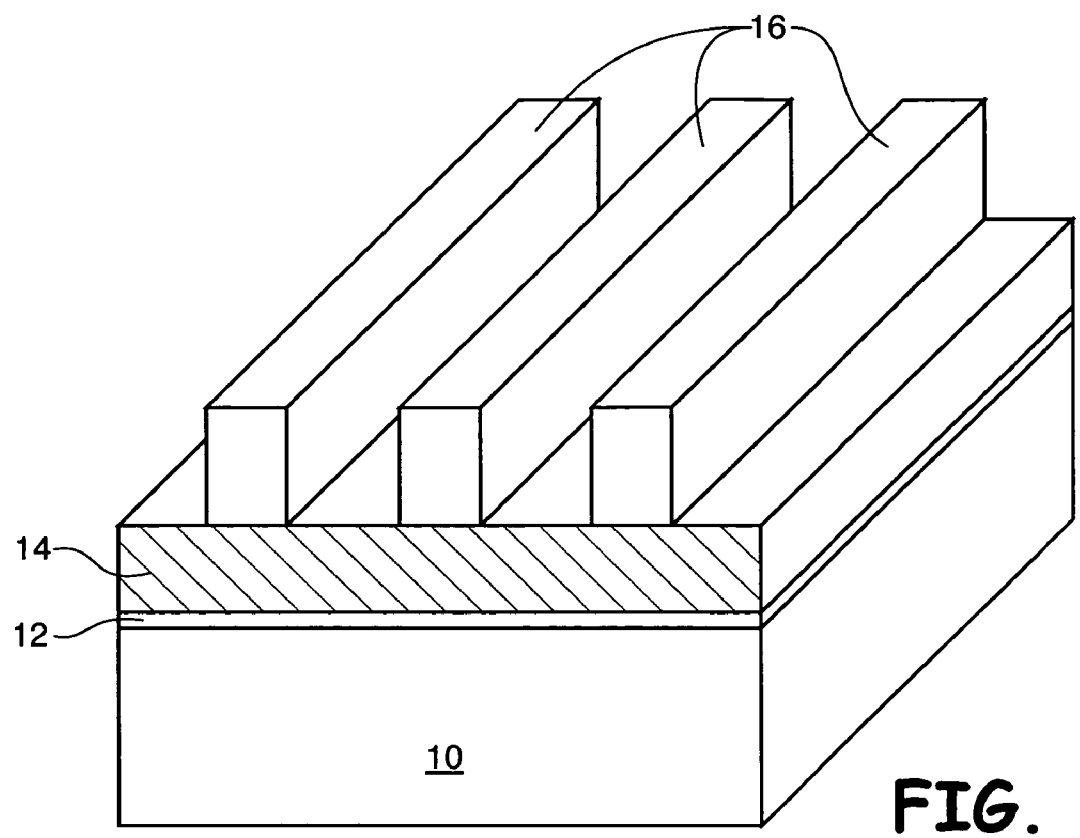
FIG. 1 is an isometric view of an in-process semiconductor device depicting a patterned photoresist layer which will define a conductive layer, such as a metal layer, into three parallel conductive lines overlaying a semiconductor wafer substrate assembly.
Figure 2:
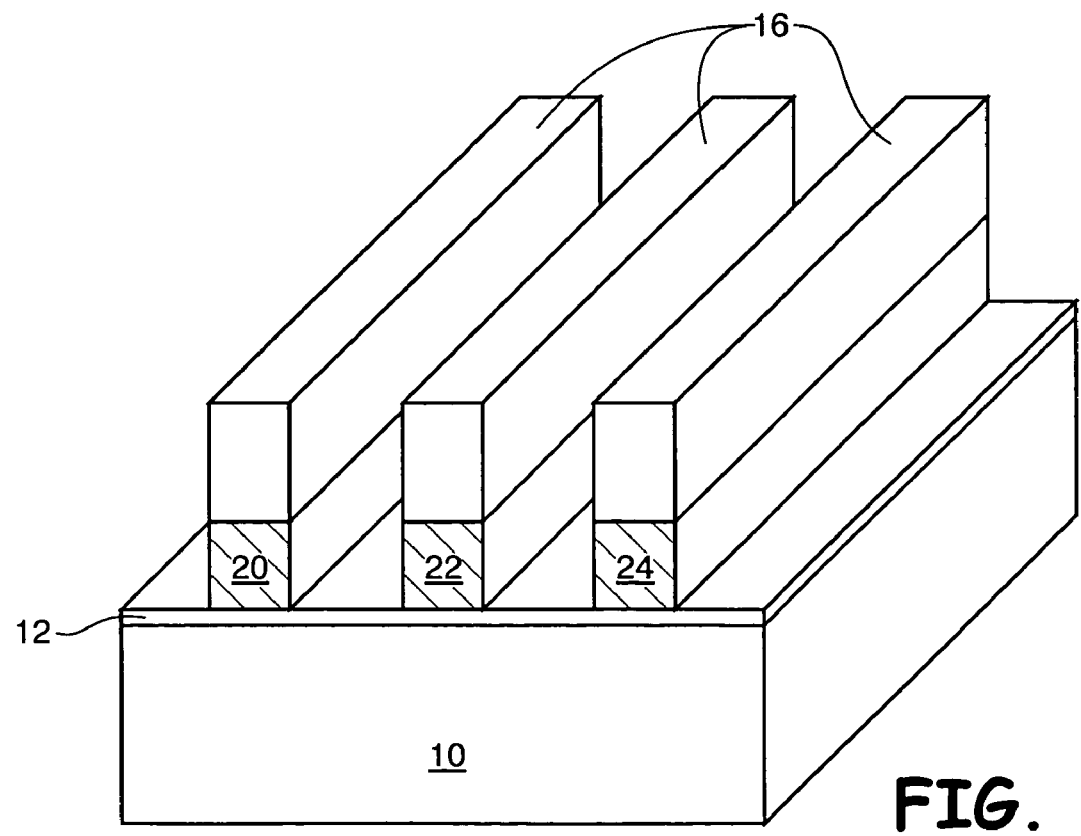
FIG. 2 depicts the structure of FIG. 1 after patterning the conductive layer.

FIG. 1 depicts a semiconductor substrate assembly 10. In one common embodiment the assembly 10 will comprise a semiconductor wafer, doped regions, transistors, and memory storage capacitors which, for simplicity, are not depicted and can be manufactured by one of ordinary skill in the art. FIG. 1 further depicts a planar dielectric layer 12 (not to scale), in this embodiment borophosphosilicate glass (BPSG) planarized to about 25,000 angstroms (Å), although other oxides such as tetraethyl orthosilicate (TEOS), phosphosilicate glass (PSG), borosilicate glass (BSG), a thermally-grown oxide layer, or other dielectrics can be used if desirable. A planar conductive layer 14 is formed over the BPSG layer, for example a sputtered alloy of aluminum (99.5%) and copper (0.5%) having a thickness of about 3,350 Å. An aluminum/copper (Al/Cu) film can be formed using argon plasma to sputter metal from Al/Cu targets onto the surface of the dielectric layer 12. An adhesion layer (not depicted) such as titanium can be applied to dielectric layer 12 if required depending on the material of layer 14, for example to prevent separation of an Al/Cu alloy layer from the surface of the dielectric 12. Other materials which would function sufficiently include titanium trialuminum ($TiAl_3$) and titanium nitride (TiN).

FIG. 1 further depicts a patterned photoresist layer 16 which will define conductive lines from the metal layer 14. FIG. 1 only depicts a portion of the photoresist pattern, which will likely comprise various angled routings. After forming the patterned photoresist 16, the metal layer 14 is etched using the photoresist as a pattern to result in the two lateral conductive lines 20, 24 and the center conductive line 22 of FIG. 2. The Al/Cu described above can be etched, for example, using an anisotropic dry etch comprising $BCl_3$, $Cl_2$, and $CH_4$ to define the conductive lines. In this embodiment the conductive lines have a width of about 0.3 micrometer (μm) and are spaced about 0.3 μm apart, resulting in a pitch of about 0.6 μm. The two outer (lateral) conductive lines depicted will eventually be fully functional, while the center line is sacrificial and will be removed during subsequent processing as described below.

It should be noted that while FIGS. 2-5 depict three conductive lines it is likely that many more lines will be formed. The terms "lateral" and "center" are therefore used in the description of an exemplary group of three lines having a sacrificial line interposed between nonsacrificial lines. In fact, there are likely to be other "center" lines which are not individually depicted located on either side of each depicted "lateral" line.

Figure 4:
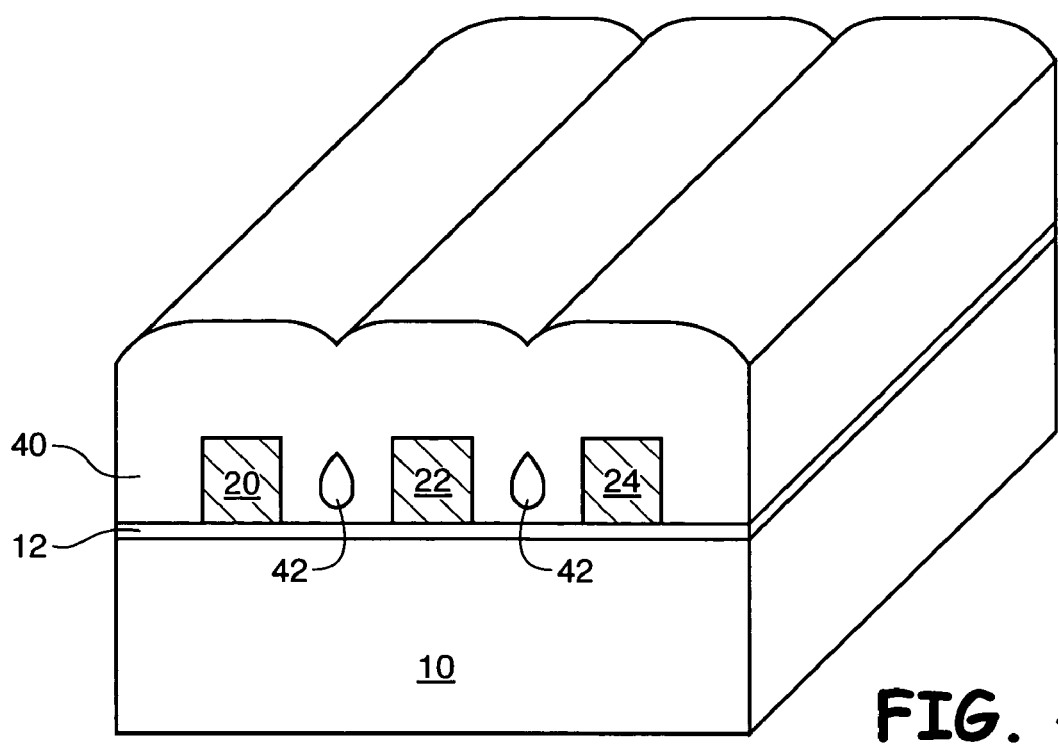
FIG. 4 depicts the FIG. 2 structure subsequent to removing the photoresist layer and after forming a first dielectric layer over the three conductive lines.

Next, the photoresist 16 is stripped and a blanket dielectric layer 40 is formed over the conductive lines 20-24 as depicted in FIG. 4. This layer can be formed using any of several processes, and several exemplary processes are described below.

In a first process a single layer of TEOS about 8,000 Å thick is formed using a liquid source such as $Si(OC_2H_5)_4$ introduced into a low pressure chemical vapor deposition (LPCVD) furnace between about 300° C. and about 450° C. After forming the TEOS layer, it can be planarized using mechanical or chemical mechanical polishing (CMP) to remove between about 2,000 Å and about 3,000 Å of material. Thus a final first layer thickness of between about 5,000 Å and about 6,000 Å remains in this embodiment.

In another process a dielectric may also be formed using a multiple layer configuration such as a deposition/etch/deposition process. These steps may form a TEOS layer as described above or some other dielectric system such as oxides from silane, BPSG, BSG, PSG, etc. Similarly, the etch step may be a facet etch, a planar etch, etc. In this exemplary process, a first sublayer between about 2,000 Å and about 10,000 Å is provided. A facet etch using a plasma etch at an angle of about 45° etches the first sublayer to aid in planarization and to remove between about 1,000 Å and about 2,000 Å of material to obtain preferential shaping of the first sublayer. A second sublayer is then formed, for example between about 2,000 Å and about 6,000 Å, to provide a first and second sublayer combination having a thickness of about 10,000 Å to about 12,000 Å. A final CMP step removes between about 5,000 Å and about 7,000 Å to result in a planar first dielectric layer having a thickness of about 5,000 Å.

The first dielectric layer can also be formed using a chemical vapor deposition (CVD) process to result in an oxide layer between about 5,000 Å and about 11,000 Å, for example about 8,000 Å.

The first dielectric layer can comprise other dielectric materials formed with one of the processes described above, or using other processes known in the art.

In contrast to the first dielectric layer formation processes described above, an alternate formation process does not include a separate planarization step. Such a process is described in U.S. Pat. Nos. 5,965,940, 5,981,384, and 5,998,256 by Werner Juengling, and No. 6,271,141 by Werner Juengling et al., each assigned to Micron Technology, Inc. and incorporated herein by reference in its entirety. The processes described in these patents, referred to hereinafter as a "Werner fill process" standardizes the distance between selected (or between all) metal features through the use of dummy metal features prior to the formation of an interlayer dielectric (ILD). This allows for the formation of a uniform ILD layer over live (active) and dummy features without the need for a reflow, CMP, or other separate planarizing step subsequent to the formation of the ILD. With many processes, using the Werner fill provides a more uniformly planar ILD layer having a more accurate thickness than is provided with conventional processes which planarize the dielectric subsequent to its formation.

FIG. 3 depicts a structure found in a first Werner fill process embodiment. FIG. 3 depicts a dummy feature 30 and another nonrelated active line 32, a live (active) feature, formed from the metal layer which forms conductive lines 20-24. While only one dummy feature 30 is depicted, it is likely a plurality of dummy features will be formed. In this embodiment the dummy feature has not been formed to provide a signal transfer path, but is instead provided for the purpose of aiding in the substantially planar formation of the first dielectric layer (40 in FIG. 4). Forming an ILD layer which is substantially planar without using a separate planarizing step is aided by standardizing the lateral distance between features which extend vertically from the wafer surface. After forming the structure of FIG. 3 an ILD layer is formed according to means known in the art, for example a layer of CVD TEOS oxide. In this embodiment, an ILD layer between about 5,000 Å and about 6,000 Å would be sufficient. As the ILD layer is formed without requiring a separate planarization, the final layer remains between about 5,000 Å and about 6,000 Å thick.

In another Werner fill process, a layer is formed in a manner similar to that in the preceding paragraph, but is formed to be between about 5,500 Å and about 8,000 Å thick. After its formation a buff is performed, which can be a light CMP step or a plasma etch, to remove between about 500 Å and about 2,000 Å. This results in a layer between about 5,000 Å and about 6,000 Å thick.

In another Werner fill process, a dielectric layer comprising a first sublayer is formed to have a thickness of between about 8,000 Å and about 10,000 Å, for example about 9,000 Å. Next, more than about half this first sublayer thickness is removed, for example between about 4,000 Å and about 5,000 Å and preferably about 4,500 Å of the first sublayer to result in a layer between about 4,000 Å and about 5,000 Å thick, and preferably about 4,500 Å thick. The layer removal can be accomplished using a planar etch such as a CMP step or a plasma etch. Finally, a second sublayer is formed to a thickness of between about 1,000 Å and about 2,000 Å to result in an ILD layer between about 5,000 Å and about 7,000 Å thick, preferably about 5,500 Å.

Regardless of the method of dielectric formation, in this embodiment a void (tunnel or gap) 42 in FIG. 4 forms in the oxide dielectric between each conductive line due to the relatively small distance between each line. These gaps, although optional, aid in further reducing the capacitive coupling between adjacent lines and are preferred if they do not adversely or excessively interfere with subsequent processing or with the function of the completed device. Some dielectrics such as BPSG have a lesser tendency to form these gaps 42 than other dielectrics such as TEOS. Deposition parameters can also affect the formation of these voids, and, in general, deposition parameters such as power, pressure, temperature, and gas flow rate will impact the formation of these voids in the dielectric. Also in this embodiment dielectric layer 40 contacts three sides of the four-sided square or rectangular cross section of conductive lines 20-24.

Figure 5:
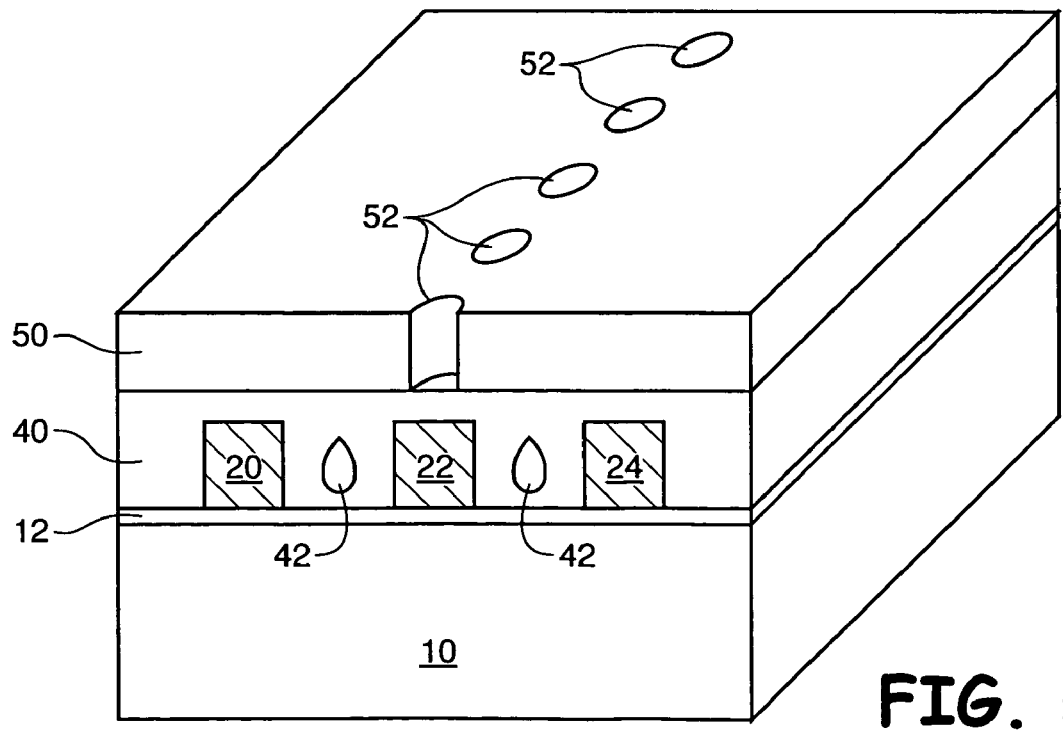
FIG. 5 depicts the structure of FIG. 4 after planarizing the first dielectric layer and after forming a patterned photoresist layer which will define openings in the first dielectric layer to expose the center conductive line.
Figure 6:
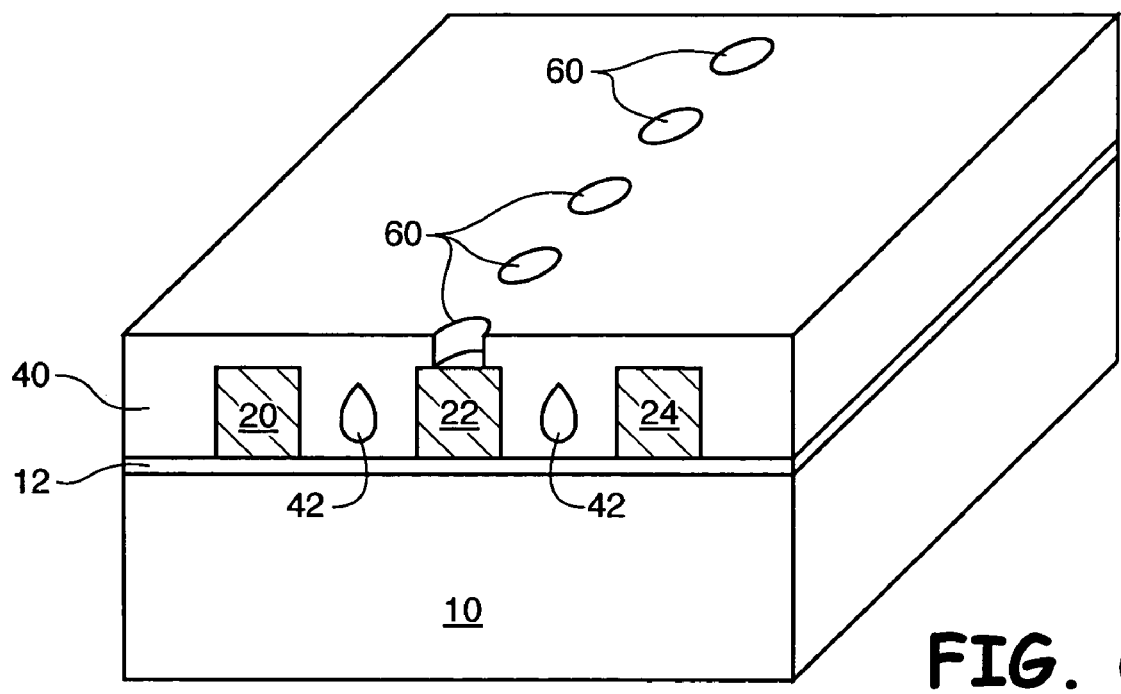
FIG. 6 depicts the FIG. 5 structure after forming openings in the dielectric layer to expose one of the conductive lines and after removing the photoresist layer.
Figure 7:
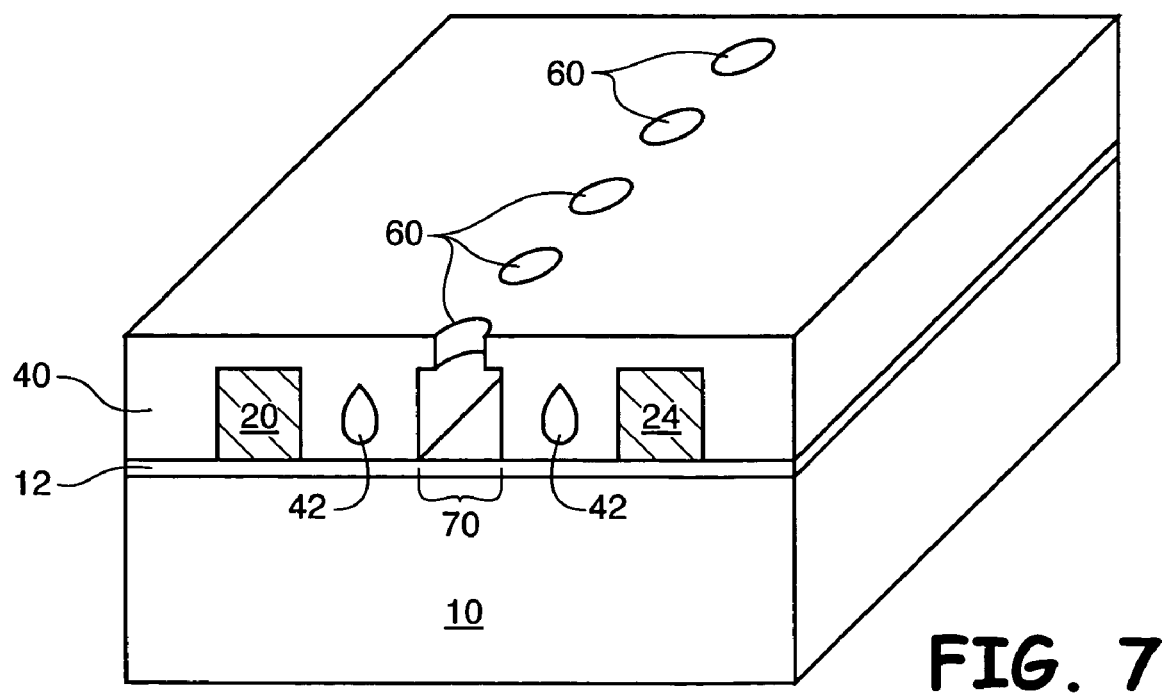
FIG. 7 depicts the FIG. 6 structure subsequent to removing the exposed conductive line.

After forming the planar dielectric layer 40 as depicted in FIG. 5, a patterned photoresist layer 50 is formed which exposes the dielectric 40 at various points along the length of the center conductive line 22. FIG. 5 depicts a photoresist layer 50 having a plurality of openings 52 formed therein to expose the dielectric layer 40 in a process similar to that used with contact openings or vias. With the conductive lines 0.3 μm wide as described above, an opening having a diameter between about 0.2 μm to about 0.3 μm and a pattern having a pitch of about 0.4 μm or greater would be sufficient. A pitch of between about one and about 100 times the diameter of the via opening would likely be sufficient, although a pitch of 100 times the diameter of the via may require an excessive etch duration. A pitch of between about one time and about 30 times the diameter of the via opening is more preferable, and a pitch of between about one time and about 15 times would be most preferable. The size and number of openings depend on the volume of the conductive line to be removed, because as both the thickness and the width of the line increases the etch time of line 22 described below will also increase if the size of opening and spacing of the openings remains constant. In order to maintain production output the openings should have a sufficient size and be sufficiently numerous to ensure that the etch time of conductive line 24 is not excessive. The openings should be small enough, however, so that another or second layer 80 (described below) fills openings or access holes 60 (described below) without allowing the fill material to enter opening 70.

After providing photoresist layer 50, the dielectric layer 40 is patterned to provide openings or access holes 60 in the dielectric layer 40 which expose the center conductive line 22. The photoresist 50 is removed to result in the FIG. 6 structure. Next, conductive line 22 is removed to result in the structure of FIG. 7. In an alternate embodiment, the etch of conductive layer 22 can also be performed with photoresist 50 in place, then the photoresist can be removed after etching layer 22. A sufficient etch is one which undercuts dielectric 40 and removes the aluminum/copper alloy conductive line 22 as well as any capping or underlying Ti, TiAl$_3$, or TiN layers selective to dielectric 40. A sufficient wet etch comprises the use of hydrochloric acid (HCl), phosphoric acid (H$_3$PO$_4$), or sulfuric acid (H$_2$SO$_4$). A sufficient dry etch chemistry includes the use of Cl$_2$ or BCl$_3$ at a pressure of about 1.0 mTorr to about 200 mTorr at a temperature of between about 20° C. to about 100° C. A dry etch which sufficiently etches Ti or TiN includes NF$_3$ or CF$_4$ at a pressure of from about 300 mTorr to about 2 Torr and a temperature of between about 100° C. to about 400° C. An alloy:dielectric etch ratio of between about 10:1 and about 1000:1 is preferable and possibly required. Removing conductive line 22 results in a void (tunnel or gap) 70 in the dielectric which extends from one opening to the next. In this embodiment, tunnel 70 has a cross-sectional area which is about equal to a cross-sectional area of each conductive line 20, 24, however this is not a requirement, and the center conductive line 22 can be formed to a different size from lines 20, 24 by changing the pattern of photoresist 16.

In other embodiments, tunnel 70 may have a prograde or retrograde cross sectional profile. This can result from removal of a conductive line 22 which has a cross section other than the square or rectangle depicted, for example having a trapezoidal or other shape. When removed, this can result in a tunnel 70 having a trapezoidal-shaped opening having a prograde or retrograde profile. Other shaped openings are also possible.

Complete removal of conductive line 22 is desirable but not required. However, capacitive coupling between conductive lines 20, 24 will increase as the post-etch remainder of conductive line 22 increases. In general, any material remaining within tunnel 70 is undesirable and would generally be unsuitable for providing an electrical pathway due to increased resistance, although some use of the structure may be possible. Any remaining conductive material will increase the capacitive coupling and will reduce the cross sectional area of the insulative tunnel.

The size of openings 42 will vary depending on the space between the conductive lines. For example, the size of opening 42 will vary from no significant opening when the space between lines 20 and 22 is greater than about 0.3 μm (3,000 Å), to having a diameter of about 0.07 μm (700 Å) when the space between 20 and 22 is about 0.2 μm (2,000 Å), depending on the deposition conditions of dielectric layer 40. A larger distance between the lines allows the dielectric to completely fill the space, while a smaller distance results in a more difficult fill between the lines and thus the resulting void. In one embodiment voids or tunnels 42 have a cross-sectional area which is between about 0.25 and about 0.75 times the cross-sectional area of the space between lines 20 and 22 and between lines 22 and 24.

Figure 8:
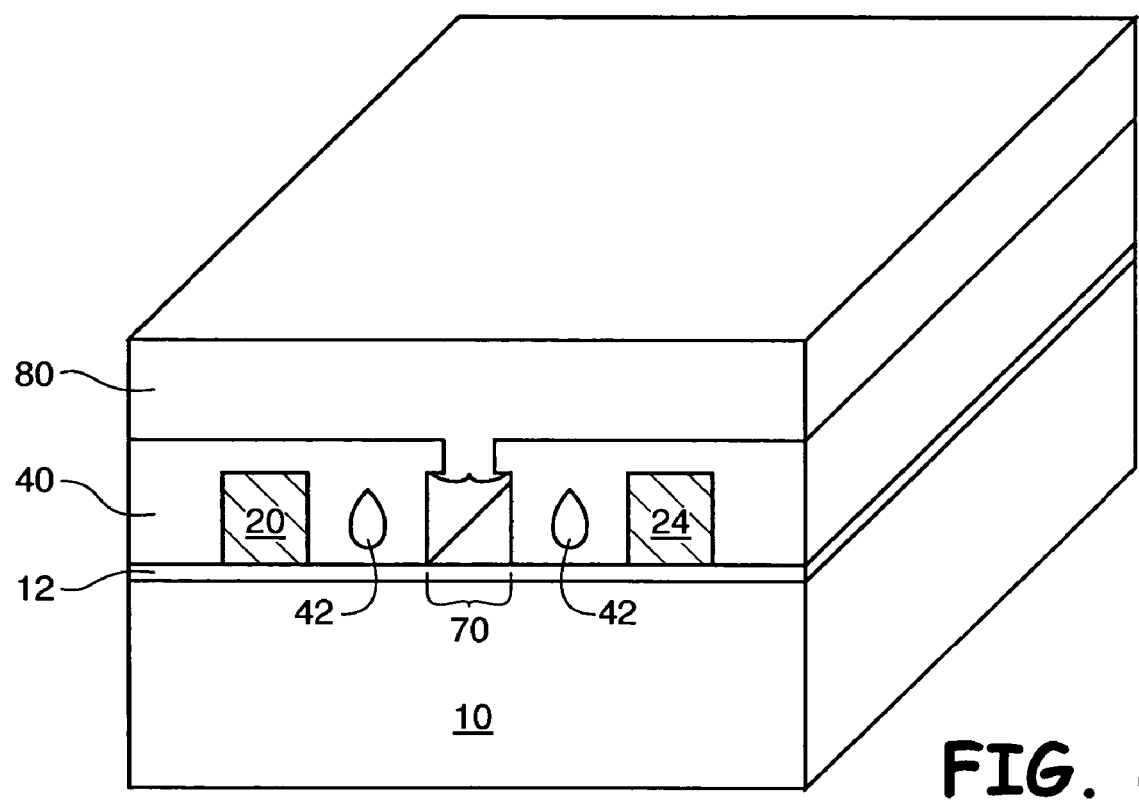
FIG. 8 depicts the FIG. 7 structure subsequent to forming a planar second dielectric layer over the conductive lines.

Subsequently, another dielectric layer 80 is formed over the surface of dielectric layer 40. Dielectric layer 80 can be planarized if desired as depicted in FIG. 8, for example using mechanical or chemical mechanical planarization. Alternately, the layer may already be sufficiently planar after its formation. After forming layer 80 the tunnel 70 within layer 40 should remain essentially empty. A nitride, TEOS, BPSG, or other dielectric layer 80 can be used. The thickness of layer 80 should be sufficient to plug the access holes 60, and thus should be at about 0.5 the diameter of the opening, or greater depending on the step coverage attainable by layer 80. Therefore, for a hole 60 having a 0.3 μm (3,000 Å) diameter, a layer at least 0.15 μm (1,500 Å) thick should be formed. Wafer processing then continues according to means in the art to form the desired semiconductor device.

As depicted in FIG. 8, the dielectric layer 40 resides in a region which extends from conductive line 20 to conductive line 24 and is interposed between conductive line 20 and line 24. Within this region are first and second tunnels 42 and a third tunnel 70.

It should be noted that this exemplary process will require modification if other materials are used for the conductive lines and dielectrics and with other material thicknesses.

A semiconductor device comprising the invention could conceivably be attached along with other devices to a printed circuit board, for example to a computer motherboard or as a part of a memory module used in a personal computer, a minicomputer, or a mainframe. The inventive device could further be useful in other electronic devices related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. An in-process semiconductor device, comprising:
   a semiconductor wafer;
   first and second adjacent spaced parallel conductive lines overlying the semiconductor wafer; and
   a dielectric layer overlying the semiconductor wafer and the first and second conductive lines, wherein the dielectric layer comprises:
   a first portion interposed between the first and second conductive lines;
   a second portion over the first and second conductive lines;
   a hollow tunnel therein interposed between the first and second conductive lines; and
   a plurality of openings therein to the hollow tunnel.

2. The in-process semiconductor device of claim 1, further comprising a mask layer overlying the dielectric layer, wherein the mask layer comprises a plurality of openings therein which are coincident with the plurality of openings to the hollow tunnel in the dielectric layer.

3. The in-process semiconductor device of claim 1, wherein:
   a cross section taken across and perpendicular with the first conductive line has a size and shape about equal to a size and shape of a cross section taken across and perpendicular with the second conductive line; and
   a cross section taken across and perpendicular with the hollow tunnel has a size and shape about equal to the size and shape of the cross section of each of the first and second conductive lines.

4. The in-process semiconductor device of claim 3 wherein the dielectric layer further comprises a first elongated void interposed between the hollow tunnel and the first conductive line, and a second elongated void interposed between the hollow tunnel and the second conductive line.

5. The in-process semiconductor device of claim 4 further comprising a mask layer overlying the dielectric layer, wherein the mask layer comprises a plurality of openings therein which are coincident with, and connect with, the plurality of openings to the hollow tunnel in the dielectric layer, and the mask layer is free from openings therein which connect with the first and second elongated voids in the dielectric layer.

6. An in-process conductive line structure for an electronic device, comprising:
   a semiconductor substrate assembly;
   first and second adjacent spaced parallel conductive lines overlying the semiconductor substrate assembly; and
   a dielectric layer overlying the semiconductor substrate assembly and the first and second conductive lines, wherein the dielectric layer comprises:
   a first portion interposed between the first and second conductive lines;
   a second portion over the first and second conductive lines;
   a hollow tunnel therein interposed between the first and second conductive lines; and
   a plurality of openings therein to the hollow tunnel.

7. The in-process conductive line structure of claim 6, further comprising a mask layer overlying the dielectric layer, wherein the mask layer comprises a plurality of openings therein which are coincident with the plurality of openings to the hollow tunnel in the dielectric layer.

8. The in-process conductive line structure of claim 6, wherein:
   a cross section taken across and perpendicular with the first conductive line has a size and shape about equal to a size and shape of a cross section taken across and perpendicular with the second conductive line; and
   a cross section taken across and perpendicular with the hollow tunnel has a size and shape about equal to the size and shape of the cross section of each of the first and second conductive lines.

9. The in-process conductive line structure of claim 8 wherein the dielectric layer further comprises a first elongated void interposed between the hollow tunnel and the first conductive line, and a second elongated void interposed between the hollow tunnel and the second conductive line.

10. The in-process conductive line structure of claim 9 further comprising a mask layer overlying the dielectric layer, wherein the mask layer comprises a plurality of openings therein which are coincident with, and connect with, the plurality of openings to the hollow tunnel in the dielectric layer, and the mask layer is free from openings therein which connect with the first and second elongated voids in the dielectric layer.

* * * * *